United States Patent
Liu et al.

(10) Patent No.: US 9,231,318 B2
(45) Date of Patent: Jan. 5, 2016

(54) INTEGRATED PACKAGE INSERTION AND LOADING MECHANISM (IPILM)

(75) Inventors: Tao Liu, Dupont, WA (US); Tejinder Pal S. Aulakh, Auburn, WA (US)

(73) Assignee: Intel Corporation, Santa Clara, CA (US)

( * ) Notice: Subject to any disclaimer, the term of this patent is extended or adjusted under 35 U.S.C. 154(b) by 227 days.

(21) Appl. No.: 13/995,927

(22) PCT Filed: Mar. 30, 2012

(86) PCT No.: PCT/US2012/031669
§ 371 (c)(1),
(2), (4) Date: Jun. 19, 2013

(87) PCT Pub. No.: WO2013/147884
PCT Pub. Date: Oct. 3, 2013

(65) Prior Publication Data
US 2014/0199873 A1    Jul. 17, 2014

(51) Int. Cl.
| | |
|---|---|
| H01R 13/62 | (2006.01) |
| H01R 4/50 | (2006.01) |
| H01L 23/32 | (2006.01) |
| H05K 7/10 | (2006.01) |
| H01R 43/20 | (2006.01) |

(52) U.S. Cl.
CPC .............. *H01R 4/5066* (2013.01); *H01L 23/32* (2013.01); *H01R 13/62* (2013.01); *H01R 43/205* (2013.01); *H05K 7/1061* (2013.01); *H01L 2924/0002* (2013.01); *Y10T 29/49128* (2015.01)

(58) Field of Classification Search
CPC .................................................... H01R 4/5066
See application file for complete search history.

(56) References Cited

U.S. PATENT DOCUMENTS

| | | | |
|---|---|---|---|
| 7,632,115 B1 | 12/2009 | Polnyi | |
| 2005/0118855 A1* | 6/2005 | Ma | 439/331 |
| 2005/0124198 A1* | 6/2005 | Ma et al. | 439/331 |
| 2005/0153582 A1* | 7/2005 | Ma | 439/73 |
| 2005/0191890 A1* | 9/2005 | Taylor et al. | 439/342 |
| 2005/0208813 A1* | 9/2005 | Trout et al. | 439/326 |
| 2007/0212917 A1 | 9/2007 | Toda et al. | |
| 2009/0061652 A1 | 3/2009 | Fan | |
| 2010/0035458 A1* | 2/2010 | Yeh et al. | 439/345 |
| 2012/0156913 A1* | 6/2012 | Haswarey et al. | 439/331 |
| 2014/0199873 A1* | 7/2014 | Liu et al. | 439/345 |
| 2014/0328037 A1* | 11/2014 | Yeh et al. | 361/760 |

OTHER PUBLICATIONS

Intel Corporation, PCT International Search Report and Written Opinion mailed Nov. 28, 2012 for PCT/US2012/031669.
Intel Corporation et al., PCT International Preliminary Report on Patentability mailed on Oct. 9, 2014 for PCT/US2012/031669.

* cited by examiner

*Primary Examiner* — James Harvey
(74) *Attorney, Agent, or Firm* — Blakely, Sokoloff, Taylor & Zafman LLP

(57) ABSTRACT

A holding member and system including a first holding member and a second holding member, wherein each of the first holding member and the second holding member are coupled to opposite sides of a load plate of a socket. A holding member includes a body including a pair of arms extending from a first side of the body and spaced to accommodate a portion of an integrated circuit chip package therebetween and at least one clip extending from a second side opposite the first side. Also, a method including coupling an integrated circuit chip package to a first holding member and a second holding member, wherein the first holding member is coupled to a first side of a load plate of a socket and the second holding member is coupled to a second side of the load plate; and inserting the package into a socket of a printed circuit board.

17 Claims, 8 Drawing Sheets

INTEGRATED PACKAGE INSERTION AND LOADING MECHANISM (IPILM)

CROSS-REFERENCE TO RELATED APPLICATION

This patent application is a U.S. National Phase Application under 35 U.S.C. §371 of International Application No. PCT/US2012/031669, filed Mar. 30, 2012, entitled INTEGRATED PACKAGE INSERTION AND LOADING MECHANISM (iPILM).

BACKGROUND

1. Field

Land grid array sockets.

2. Description of Related Art

A land grid array (LGA) is a type of surface-mount packaging for integrated circuits. An LGA socket can be electrically connected to a printed circuit board and finds use as a physical interface for a microprocessor. Representatively, an LGA socket includes protruding pins or lands which touch contact points on a device side of a microprocessor. The microprocessor is pressed into place by an independent loading mechanism that includes a load plate and a frame. An installing technician lifts the hinged load plate, inserts the microprocessor, closes the load plate over the top of the processor into the frame and pushes down a locking load lever. The pressure of the locking lever on the load plate clamps the contact points of the microprocessor firmly down onto socket of the printed circuit board (e.g., a motherboard) pins or lands. A typical load plate only covers the edges of a top surface of the microprocessor which leaves the center of the microprocessor free to make contact with or be adjacent to a cooling device placed on top of the microprocessor.

As noted above, insertion of a processor in the socket is typically done by hand which can result in bent contacts which renders the socket useless before being repaired and/or replaced. Bent contacts in LGA sockets is a defect introduced during board and system assembly that has caused millions of dollars for the computer industry since the introduction of the sockets. Mitigation methods, including customized independent loading mechanisms, have been tried with varied success.

DETAILED DESCRIPTION

A typical land grid array (LGA) socket includes a contact array disposed within a socket body that includes package orientation keys, and an independent loading mechanism to distribute a load to the LGA and ensure electrical connection between package pads and socket contacts, and a load lever to lock the load plate in place.

As noted, the LGA socket contains a package on a printed circuit board. A typical package includes an integrated circuit chip, such as a processor having a number of contacts in the form of pads or solder balls on pads on one side and an integrated heat spreader (IHS) coupled to a second opposite side. One particular IHS is referred to as a winged IHS because it includes a pair of laterally disposed wings extending respectively from opposite sides.

Figure 1:
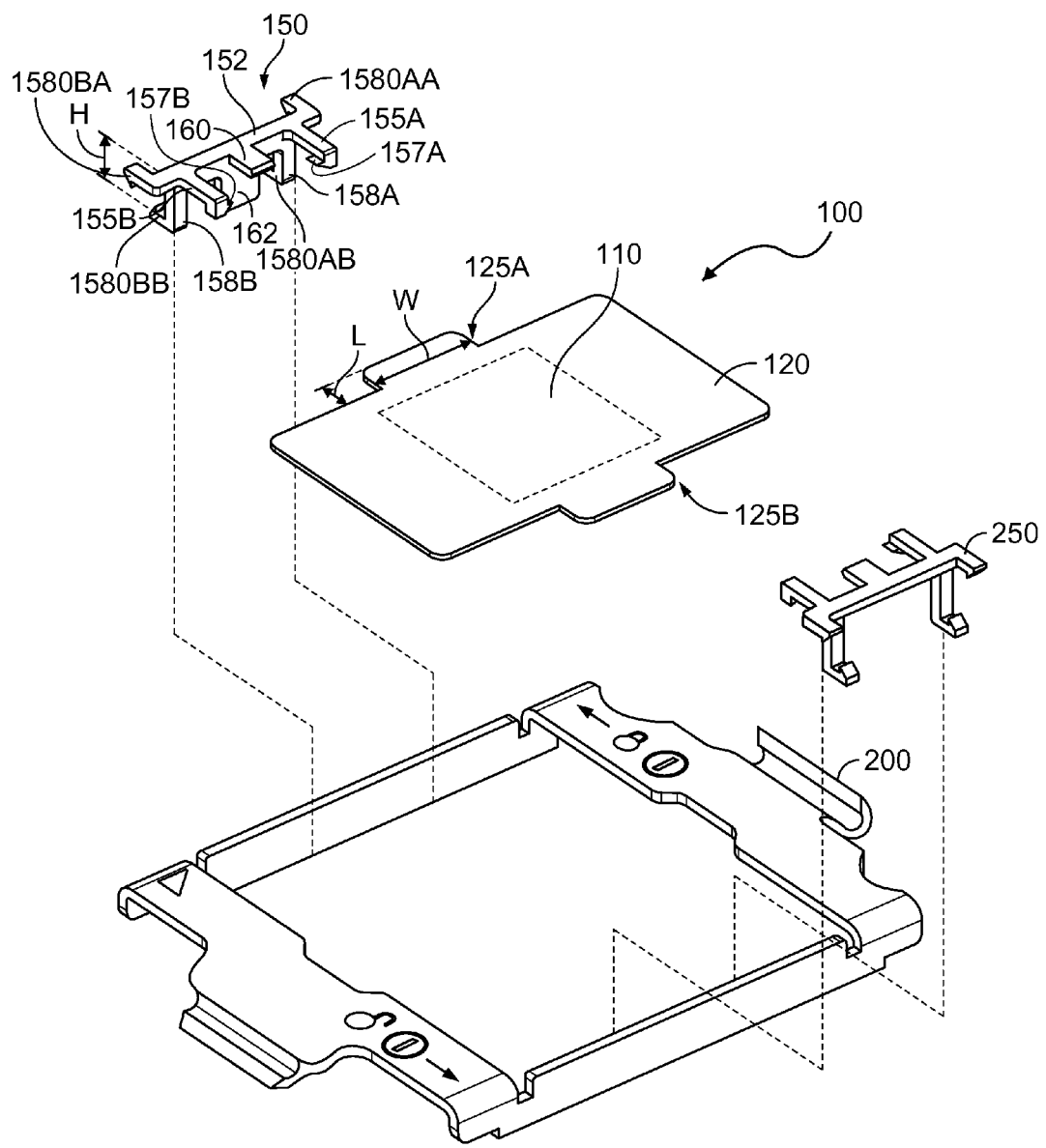
FIG. 1 shows an exploded top perspective view of an integrated circuit package including an integrated heat spreader and an embodiment of a pair of grippers and a load plate of a socket.

FIG. 1 illustrates an embodiment of a package including a winged IHS. Referring to FIG. 1, winged package 100 includes integrated circuit device 110, such as a microprocessor. Connected to a backside (non-device side) of device 110 by, for example, an adhesive, is IHS 120 of, for example, a metal material such as copper or a copper-tin alloy. IHS 120 is a generally rectangular, planar structure having a thickness on the order of two millimeters (mm). In the embodiment shown in FIG. 1, the generally rectangular structure includes opposing laterally extending wings 125A and 125B. In one embodiment, each wing has a width, W, on the order of 12.75 mm and a protruding length, L, of 4.45 mm and a generally an equivalent thickness as a remainder of the IHS body so that collectively, the wings and a remainder of the IHS body may, in one embodiment, define a generally planar surface alignment. In another embodiment, the wings may not be in a generally planar surface with a remainder of the IHS body.

In one embodiment, an LGA socket configuration or system is described to take advantage of the winged geometry of the IHS. The configuration or system adds a gripper and, in another embodiment, a pair of grippers to a load plate of an LGA socket to grip or hold or contain a package and aid in the incorporation of the package into a socket.

FIG. 1 shows an isometric exploded view of a pair of grippers or holding members connected to opposite sides of a load plate. FIG. 1 illustrates gripper or holding member 150 connected to a first side of load plate 200 and gripper or holding member 250 to a second opposite side of load plate 200. In this embodiment, gripper or holding member 150 and gripper or holding member 250 are of similar configuration so detailed reference in FIG. 1 to that configuration will hereinafter be with respect to gripper or holding member 150.

Referring to FIG. 1, gripper or holding member 150 includes a body including a pair of arms 155A, 155B extending from a first side of body 152 and spaced to accommodate no more than a portion of an integrated circuit chip package therebetween. In the embodiment shown in FIG. 1, arm 155A and arm 155B are spaced from one another at least a distance equivalent to the width, W, of wing 125A of IHS 120 to accommodate wing 125A therebetween. In one embodiment, each arm extends a length from body 152 that is less than or equivalent to or more than the protruding length, L, of wing 125A of IHS 120. In one embodiment, a representative length is on the order of 6.5 mm. A representative width dimension for arm 155A and arm 155B is on the order of 2 mm. A base of each arm 155A, 155B includes shelf 157A and shelf 157B extending, in this embodiment, at a 90° angle from a base of each arm (as viewed) toward the other arm (e.g., extending 1-2 mm beyond the 2 mm width of the arm toward the other arm). In the embodiment shown in FIG. 1, shelf 157A and shelf 157B are positioned at a distal end of respective arms 155A and 155B. In another embodiment, each shelf may extend along a larger portion of a respective arm, such as entire length of the arm.

As noted above, gripper or holding member is configured to be connected to a side of a load plate. Thus, in one embodiment, gripper or holding member 150 includes at least one clip to accomplish the connection. Referring to FIG. 1, gripper 150 includes, in this embodiment, clip 158A and clip 158B extending from a second side of body 152 opposite the side from which arm 155A and arm 155B extend. Clip 158A and clip 158B are configured to connect to a side of a load plate. In the configuration shown in FIG. 1, clip 158A and clip 158B include a pair of arms extending in the second direction. FIG. 1 shows arm 1580AA and 1580AB extending from a second side of clip 158A extending from a second side of body 152 and arms 1580BA and 1580BB extending from a body of clip 158B on a second side of body 152. A representative length of each arm is on the order of 2.5 mm. A representative width dimension for each arm is on the order of 2 mm. A distal end of each arm includes a projection (a hook) on the order of 1 mm in the direction of its paired arm. The projections may be used to go over a side of a load plate to aid in gripping of the load plate.

In the embodiment shown in FIG. 1, a distance between arm 1580AA of clip 158A and arm 1580BA of clip 158B is greater than a distance between arm 1580AB and arm 1580BB. Representatively, arm 1580AA and arm 1580BA extend from opposite ends of body 152 and are separated by a distance of 20 mm while arm 1580AB and arm 1580BB are separated by a distance equivalent to a distance between arm 155A and arm 155B (e.g., 13 mm). In another embodiment, arm 1580AA and arm 1580BA may be separated by a similar amount to the distance that separates arm 1580AB and arm 1580BB, e.g., by a distance equivalent to a distance between arm 155A and arm 155B (e.g., 13 mm).

FIG. 1 shows arm 1580AA and arm 1580BB in a similar superior plane (as viewed) as arm 155A and arm 155B. FIG. 1 also shows arm 1580AA of a first clip separated from arm 1580AB and arm 1580BA of a second clip separated from arm 1580BB by height, H that, in one embodiment, is equivalent to a height of a side of a load plate. A representative height, H, is on the order of 5.75 mm. In the embodiment, each of arm 1580AB and arm 1580BB extend from respective legs that extend from body 152 at an angle perpendicular to the body and arms 155A and arm 155B.

FIG. 1 also shows gripper or holding member 150, in one embodiment, includes stop 160 extending from the first side of body 152 in a superior plane (as viewed) similar to the plane as arms 155A and 155B and between the arms. In one embodiment, stop 160 has a sufficient thickness to inhibit a lateral movement of a portion of the package that may be disposed between arm 155A and arm 155B (e.g., wing portion 125A of IHS 120). A distal end of stop 160 may have a recessed angle (e.g., recessed 45°). In another embodiment, stop 160 has a thickness that is less than a thickness of each of the pair of arms such that a difference in the thickness of the stop and thickness of each of the pair of arms is greater than a thickness of a portion of an integrated circuit package that the gripper will be holding. As noted above, arm 155A includes shelf 157A and arm 155B includes shelf 157B. In one embodiment, shelf 157A and shelf 157B project from their respective arms toward one another below a thickness of stop 160 so that a height difference between the shelf and an underside of stop 160 is at least equivalent to a thickness of the portion of package 100 that will be disposed between arm 155A and arm 155B. In the embodiment where wing portion 125A of IHS 120 may be disposed between arm 155A and arm 155B of gripper 150, a distance between an underside of stop 160 and shelf 157A and shelf 157B is at least equal to a thickness of wing portion 125A of IHS 120 so that the wing portion 125A may be disposed on shelf 157A and shelf 157B between arms 155A and 155B and beneath stop 160 as viewed.

In the embodiment shown in FIG. 1, gripper or holding member 150 further includes wall 162 extending vertically downward from body 152 between clip 158A and clip 158B. When gripper or holding member 150 is attached to a side wall of a load plate (e.g., a side wall of load plate 200), wall 162 is flush with the side wall of the load plate and inhibits the gripper from rotating during the package installation.

In one embodiment, a gripper or holding member such as gripper 150 may be made of a plastic material such as polycarbonate. One way gripper 150 may be made is through a molding process to define the gripper as a unitary structure.

Figure 2:
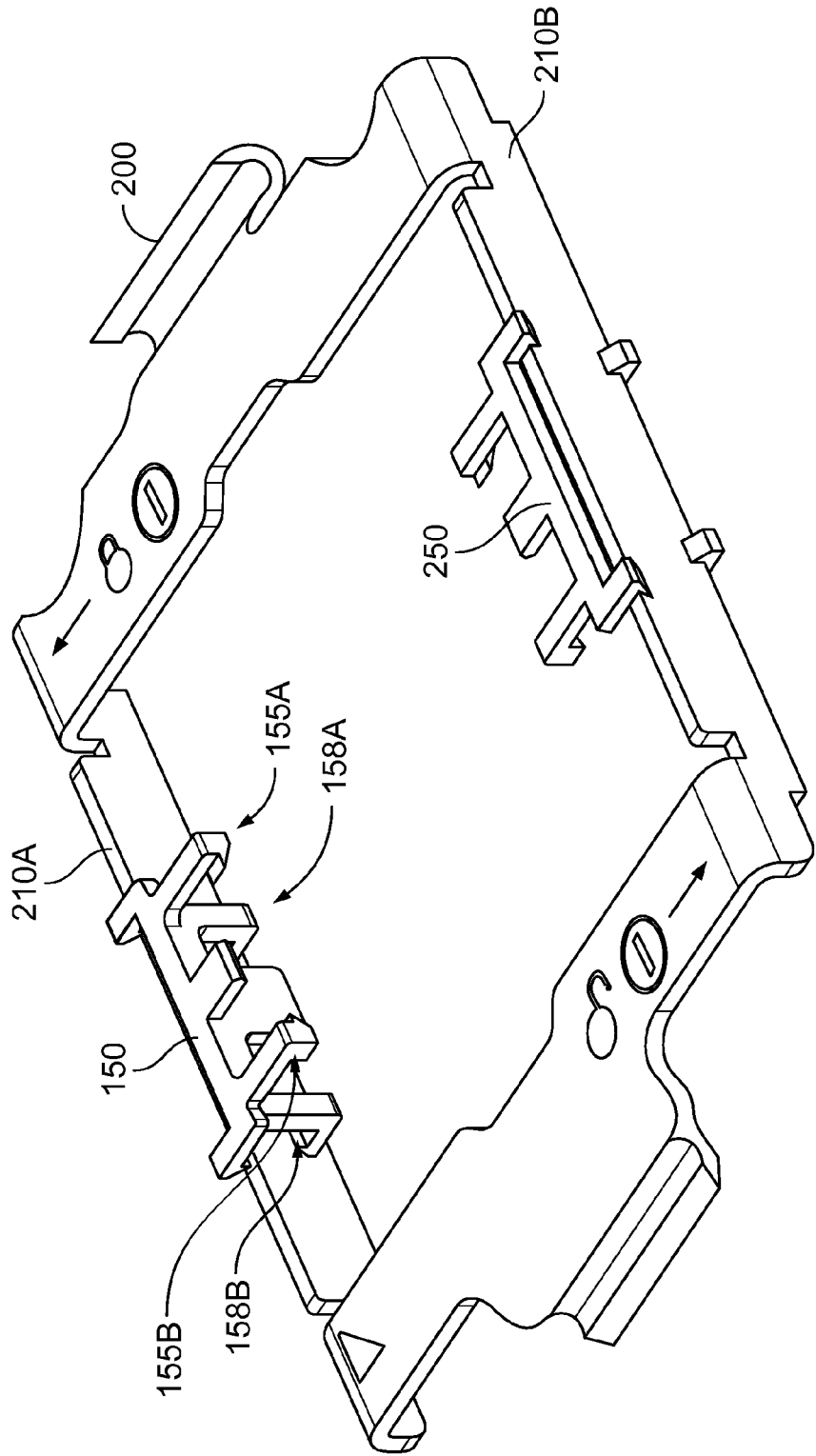
FIG. 2 shows a top perspective view of the grippers of FIG. 1 connected to the load plate.

FIG. 2 shows a top perspective view of a load plate including a pair of grippers. FIG. 2 shows load plate 200 including first side 210A and opposing second side 210B. Connected to each side is a gripper or holding member. FIG. 2 shows gripper 150 connected to side 210A through clip 158A and clip 158B. As connected, arm 155A and arm 155B of gripper 150 extend toward side 210B of load plate 200. FIG. 2 also shows second gripper or holding member 250 connected in a similar manner to side 210B of load plate 200 having arms extending toward side 210A.

Figure 3:
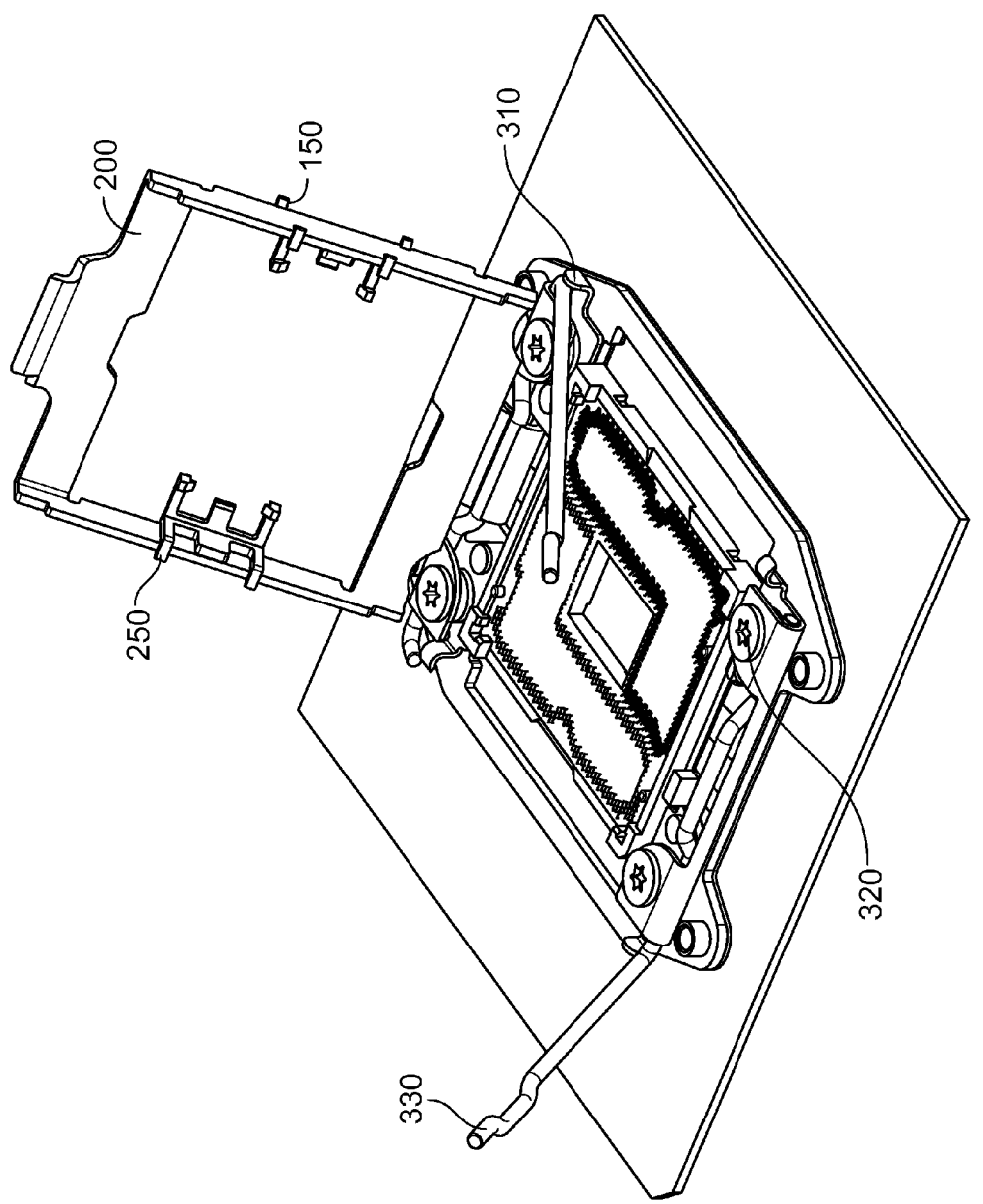
FIG. 3 shows a top perspective front view and an embodiment of an independent loading mechanism including the grippers of FIG. 1 connected to the load plate.

FIG. 3 shows an embodiment of a fully assembled independent loading mechanism (ILM) of a LGA package. In this embodiment, the ILM includes load plate 200 having gripper 150 and gripper 250 connected to the opposite sides of the load plate. The ILM also includes frame 310 and captive fasteners 320. FIG. 3 shows further load lever 330.

Figure 4:
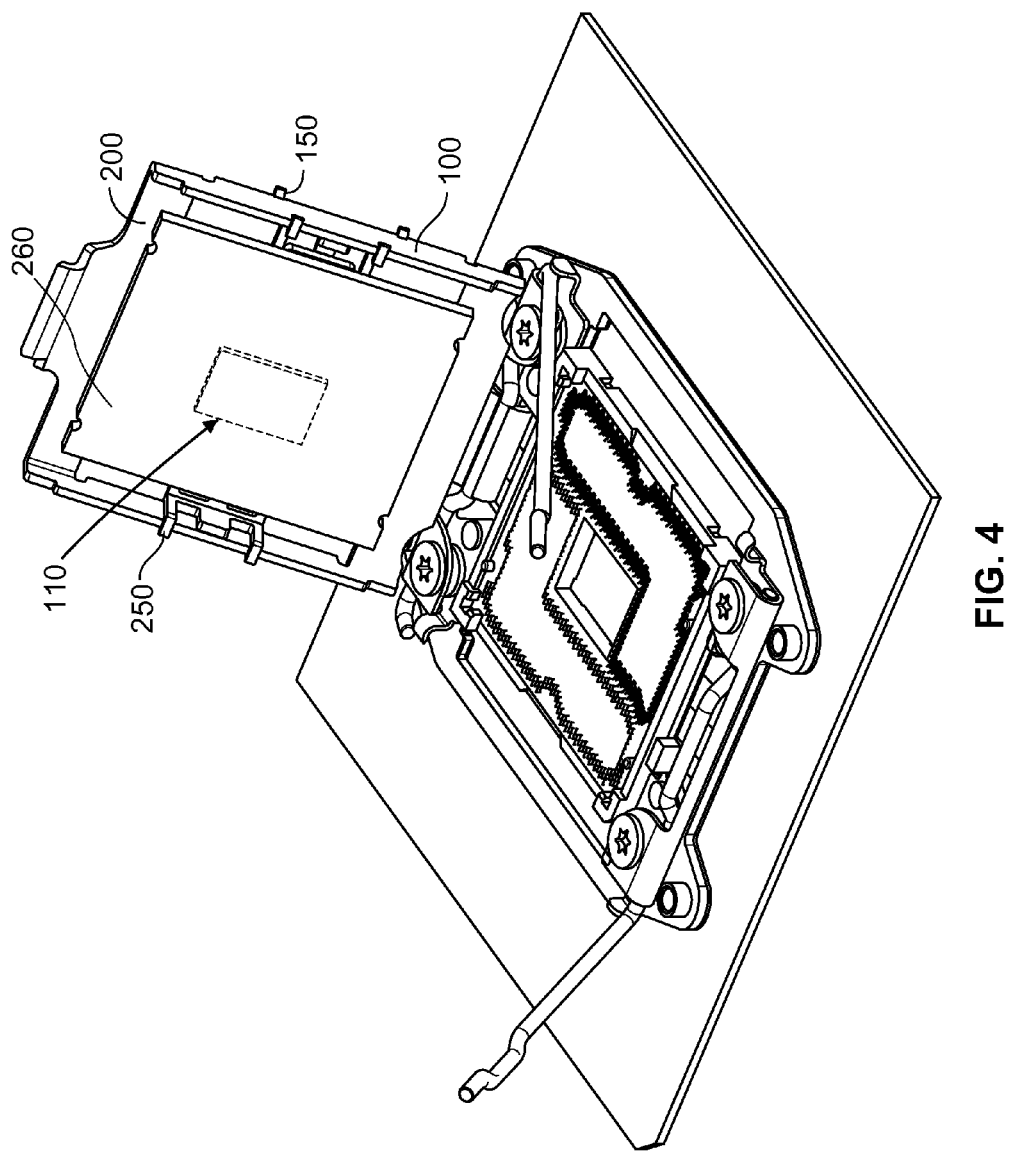
FIG. 4 shows a top perspective front view of the structure of FIG. 3 with a package connected to the load plate through the grippers.
Figure 5:
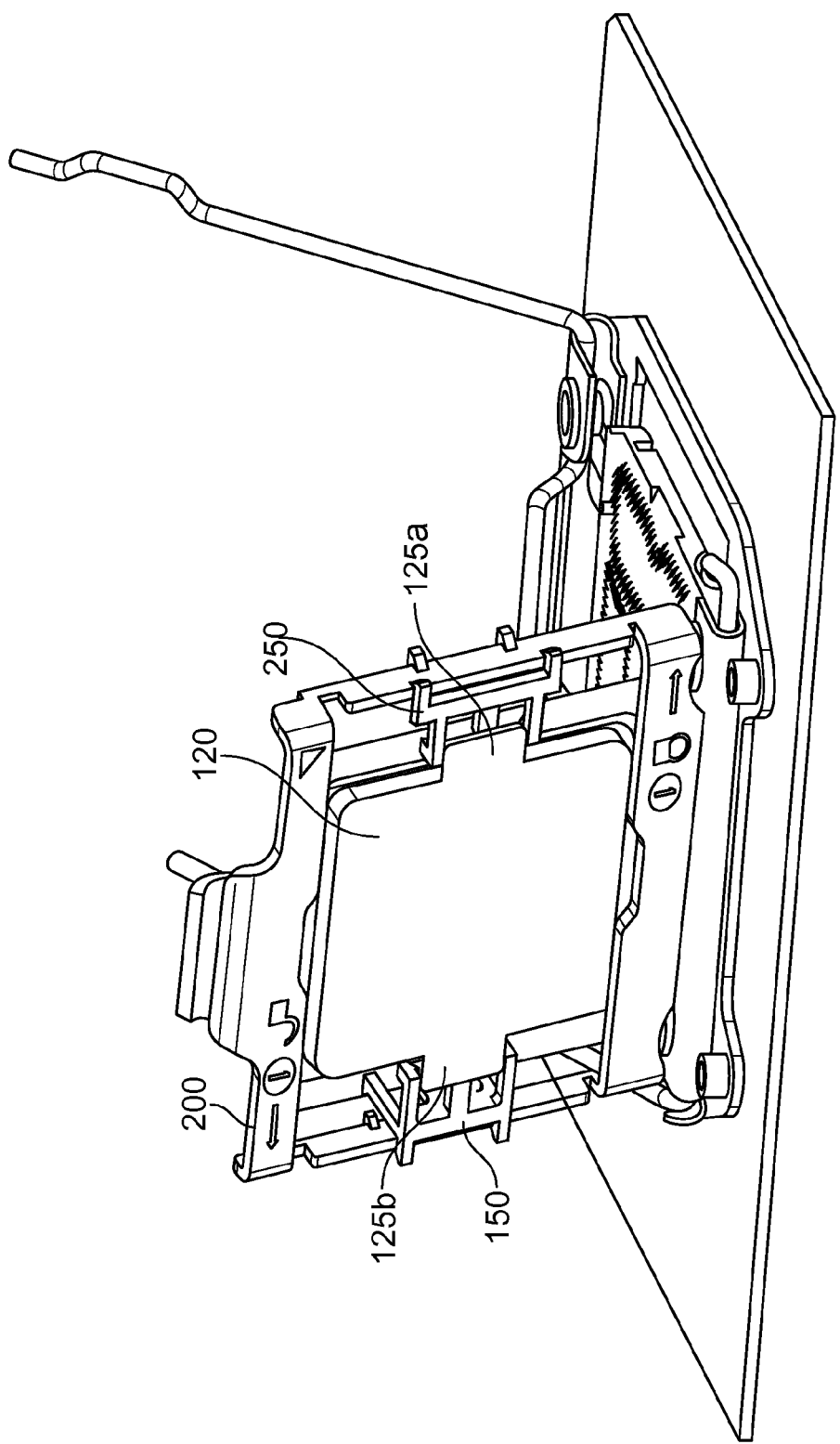
FIG. 5 shows a top perspective back view of the structure of FIG. 3 with a package connected to the load plate through the grippers.

FIGS. 4-7 show the insertion of a package into an ILM and the closing of the ILM. FIGS. 4 and 5 show front and back asymmetric views of a LGA socket assembly having a package snapped/receded into grippers or holding members on opposite side of a load plate of the socket. As described above with respect to FIG. 1, in one embodiment, the package is inserted on the shelves of respective arms and is held by the arms of the load plate through the arms of gripper 150 and gripper 250. In FIG. 4, a device side of the package is shown. In this embodiment, substrate circuit board 260 is disposed on device 110. FIG. 5 shows IHS 120 having wings 125A and 125B where wing 125A and wing 125B are respectively connected to gripper 150 and gripper 250. In one embodiment, respective shelves of each of gripper 150 and gripper 250 are positioned to establish a desired z-direction reference for each gripper, thereby a z-stop or reference for the package, position for the package during integration and insertion.

Figure 6:
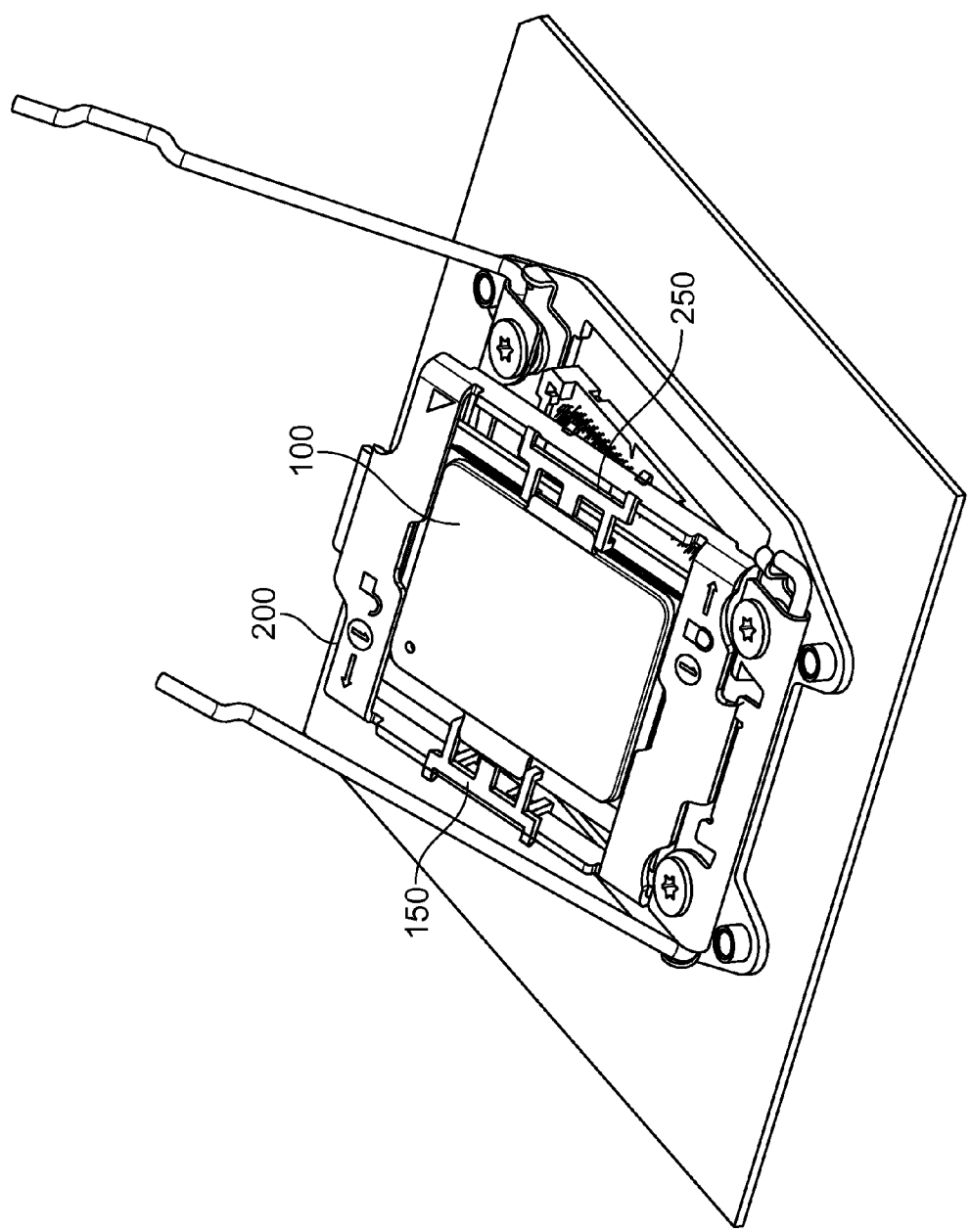
FIG. 6 shows a top perspective back view of the structure of FIG. 5 and illustrates the closing of the load plate.
Figure 7:
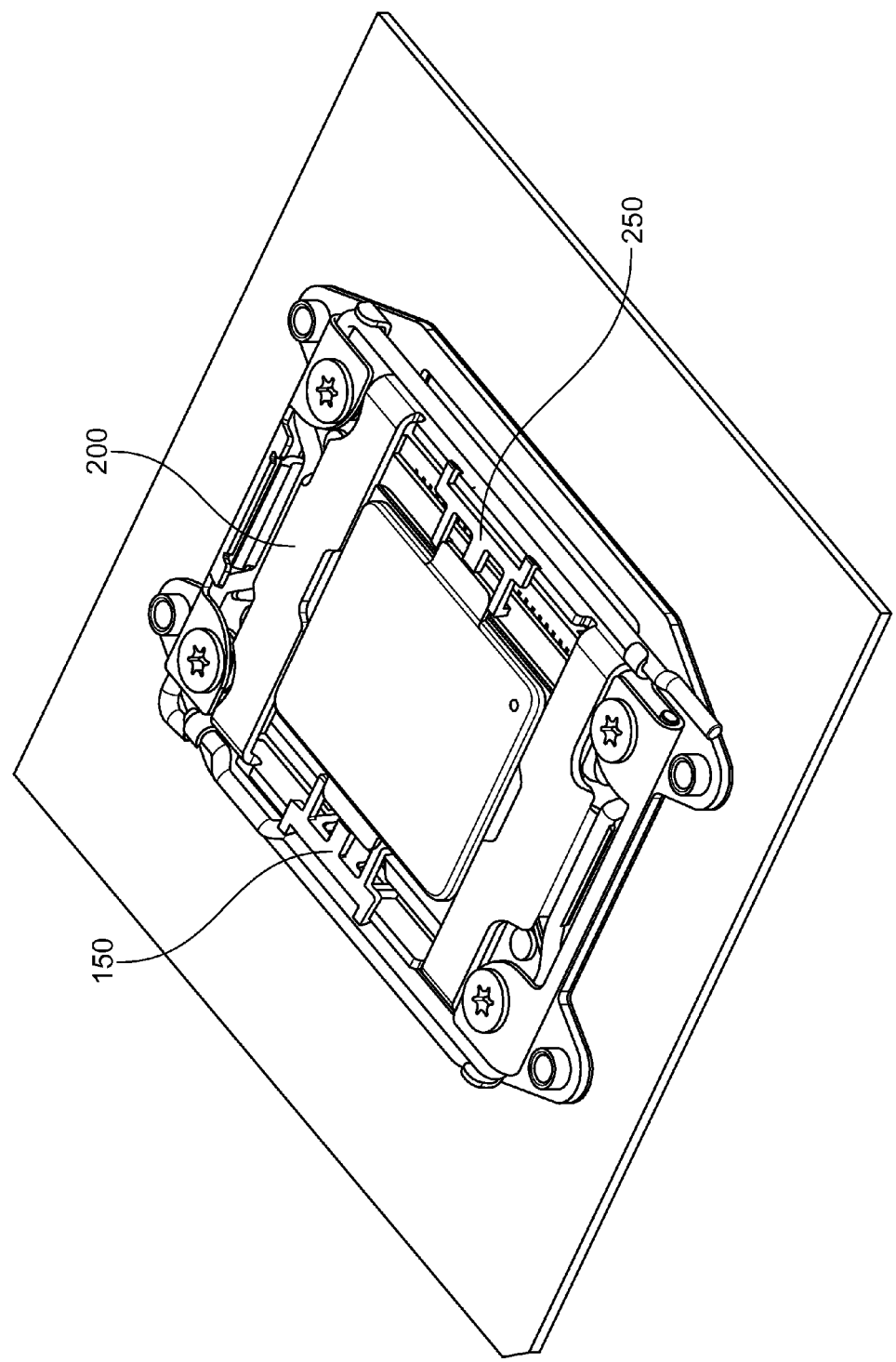
FIG. 7 shows the structure of FIG. 6 following the closing of the load plate.

Once package 100 is seated in load plate 200 of the ILM by gripper 150 and gripper 250, the load plate may be closed to complete the package insertion in the socket. FIG. 6 shows the closing of the load plate with a package seated within. A gross alignment of the package with respect to the socket is done through the position of gripper 150 and gripper 250 on the ILM load plate. A median alignment may be accomplished through socket wall chamfers and fine alignment by tightly tolerance existing socket wall feature. FIG. 7 shows a fully inserted package and closed ILM.

Figure 8:
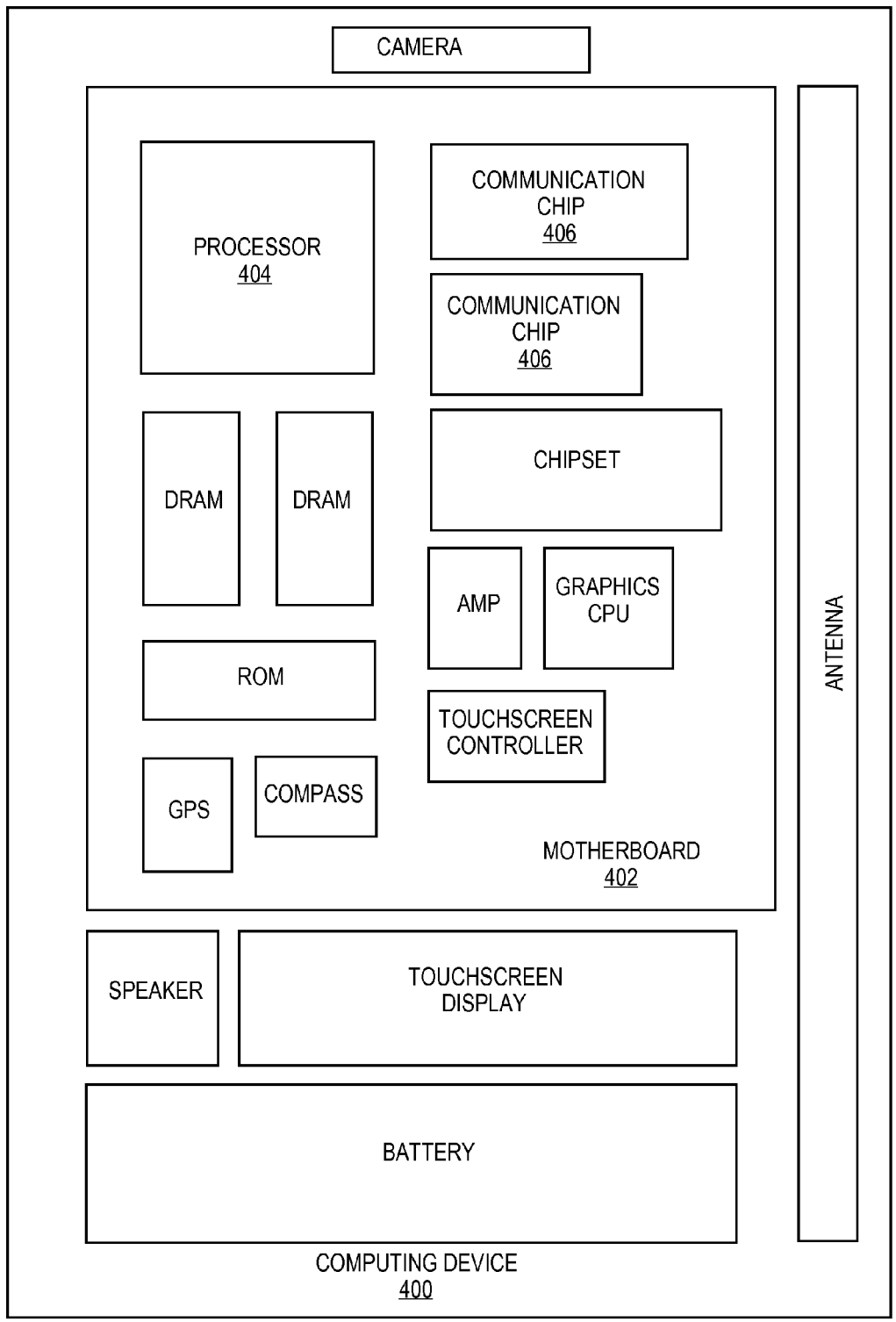
FIG. 8 illustrates a computing device in accordance with one implementation.

FIG. 8 illustrates a computing device 400 in accordance with one implementation. Computing device 400 houses board 402. Board 402 may include a number of components, including but not limited to processor 404 and at least one communication chip 406. Processor 404 is physically and electrically coupled to board 402 through a land grid array socket incorporating a gripper or grippers in an ILM. In some implementations the at least one communication chip 406 is also physically and electrically coupled to board 402. In further implementations, communication chip 406 is part of processor 404.

Depending on its applications, computing device 400 may include other components that may or may not be physically and electrically coupled to board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. The term "processor" may refer to any device or portion of a device that processes electronic data from registers and/or memory to transform that electronic data into other electronic data that may be stored in registers and/or memory.

Communication chip 406 also includes an integrated circuit die packaged within communication chip 406.

In various implementations, computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

The invention claimed is:

1. A system comprising:
a first holding member and a second holding member, wherein each of the first holding member and the second holding member are coupled to opposite sides of a load plate of a socket, each of the first holding member and the second holding member comprising a body comprising a pair of arms extending from a first side of the body and spaced to accommodate no more than a portion of an integrated circuit chip package therebetween and at least one clip extending from a second side opposite the first side, wherein when the respective pair of arms are positioned such that an integrated circuit chip can be disposed within the load plate and supported between the arms of the first holding member and the arms of the second holding member.

2. The system of claim 1, wherein the at least one clip comprises a first clip and a second clip.

3. The system of claim 2, wherein the pair of arms comprises a first pair of arms and the first clip and the second clip each comprise a second pair of arms extending from the second side of the body and separated by a distance equivalent to a height of a side of the load plate.

4. The system of claim 2, wherein a first of the second pair of arms of each of the first clip and the second clip and the first pair of arms are in the same plane.

5. The system of claim 1, wherein each of the pair of arms comprise an inward projecting shelf.

6. The system of claim 5, wherein the body of the first holding member and the second holding member further comprises a stop extending from the first side of the body in the same plane as the pair of arms and between the pair of arms, the stop having a thickness that is less than a thickness of each of the pair of arms such that a difference in the thickness of the stop and the thickness of each of the pair of arms is greater than a thickness of a portion of an integrated circuit chip package.

7. The system of claim 1, wherein the pair of arms comprises a first pair of arms and the body comprises at least one leg extending from the body at an angle perpendicular to a plane defined by the first pair of arms and the at least one clip comprises a second pair of arms, a first of the second pair of arms extending from the body in the plane defined by the first pair of arms and a second of the second pair of arms extending from the at least one leg, wherein the first of the second pair of arms and the second of the second pair of arms are separated by a distance equivalent to a height of a side of the load plate.

8. The system of claim 1, wherein the pair of arms are spaced to accommodate no more than a width of a wing of an integrated circuit chip package.

9. An apparatus comprising:
   a body comprising a first pair of arms extending from a first side of the body and spaced to accommodate no more than a portion of an integrated circuit chip therebetween, at least one leg extending from the body at an angle perpendicular to a plane defined by the first pair of arms and at least one clip comprising a second pair of arms extending from a second side of the body opposite the first side, wherein a first of the second pair of arms extends from a second side of the body opposite the first side and a second of the second pair of arms extends in the same direction from the at least one leg and the second pair of arms are separated by a distance equivalent to a height of a side of a load plate.

10. The apparatus of claim 9, wherein the first of the pair of arms of the at least one clip extends from the body in the plane defined by the first pair of arms.

11. The apparatus of claim 9, wherein the at least one leg comprises a first leg and a second leg and the at least one clip comprises a first clip and a second clip.

12. The apparatus of claim 11, wherein the body further comprises a stop disposed between the first leg and the second leg and extending from body at an angle perpendicular to the plane defined by the first pair of arms.

13. The apparatus of claim 9, wherein the body further comprises a stop extending from the first side of the body in the same plane as the first pair of arms and between the first pair of arms, the stop having a thickness that is less than a thickness of each of the first pair of arms such that a difference in the thickness of the stop and the thickness of each of the first pair of arms is greater than a thickness of a portion of an integrated circuit chip.

14. The apparatus of claim 9, wherein the at least one leg comprises a first leg and a second leg and the at least one clip comprises a first clip and a second clip, a first stop disposed between the first leg and the second leg and extending from body at an angle perpendicular to the plane defined by the first pair of arms, and a second stop extending from the first side of the body in the same plane as the first pair of arms and between the first pair of arms, the stop having a thickness that is less than a thickness of each of the first pair of arms such that a difference in the thickness of the stop and the thickness of each of the first pair of arms is greater than a thickness of a portion of an integrated circuit chip.

15. A method comprising:
   coupling an integrated circuit chip package to a first holding member and a second holding member, wherein each of the first holding member and the second holding member comprise a body comprising a pair of arms extending from a first side of the body and spaced to accommodate no more than a portion of an integrated circuit chip package therebetween and at least one clip extending from a second side opposite the first side, and wherein the first holding member is coupled to a first side of a load plate of a socket and the second holding member is coupled to a second side of the load plate; and
   inserting the package into a socket of a printed circuit board.

16. The method of claim 15, wherein the load plate is coupled to the socket by a side hinge coupling and inserting the package into the socket comprises rotating the load plate about an axis defined by the hinge.

17. The method of claim 15, wherein the chip package comprises a winged package comprising a first wing and a second wing and coupling the integrated circuit chip package to a first holding member comprises coupling the first wing to the first holding member and coupling the second holding member comprises coupling the second wing to the second holding member.

* * * * *